United States Patent
Okuyama et al.

(10) Patent No.: US 10,794,935 B2
(45) Date of Patent: Oct. 6, 2020

(54) CURRENT SENSOR

(71) Applicant: Hitachi Metals, Ltd., Tokyo (JP)

(72) Inventors: Ken Okuyama, Tokyo (JP); Katsuya Akimoto, Tokyo (JP); Naoki Futakuchi, Tokyo (JP); Haruyasu Komano, Tokyo (JP); Jun Umetsu, Tokyo (JP); Yujiro Tomita, Tokyo (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/912,138

(22) Filed: Mar. 5, 2018

(65) Prior Publication Data

US 2018/0284162 A1 Oct. 4, 2018

(30) Foreign Application Priority Data

Mar. 30, 2017 (JP) .................. 2017-067179

(51) Int. Cl.
  *G01R 15/20* (2006.01)
  *G01R 33/09* (2006.01)
  *G01R 19/00* (2006.01)

(52) U.S. Cl.
  CPC ......... *G01R 15/205* (2013.01); *G01R 15/207* (2013.01); *G01R 19/0092* (2013.01); *G01R 33/093* (2013.01)

(58) Field of Classification Search
  None
  See application file for complete search history.

(56) References Cited

U.S. PATENT DOCUMENTS

| | | | | |
|---|---|---|---|---|
| 5,014,043 A | * | 5/1991 | Lopetrone | G01R 15/202 324/529 |
| 5,097,200 A | * | 3/1992 | Mendel | H01J 17/14 324/71.3 |
| 7,642,768 B1 | * | 1/2010 | Kinzel | G01R 15/207 324/117 H |
| 2007/0200551 A1 | | 8/2007 | Muraki et al. | |
| 2008/0094060 A1 | * | 4/2008 | Muraki | B82Y 25/00 324/252 |

(Continued)

FOREIGN PATENT DOCUMENTS

| JP | 2003-329749 A | 11/2003 |
|---|---|---|
| JP | 4612554 B2 | 1/2011 |
| JP | 2013-011469 A | 1/2013 |

OTHER PUBLICATIONS

Japanese Office Action dated Aug. 18, 2020 with an English translation thereof.

*Primary Examiner* — Nasima Monsur
(74) *Attorney, Agent, or Firm* — McGinn I. P. Law Group, PLLC

(57) ABSTRACT

A current sensor includes a bus bar through which a measured current is carried, a pair of shielding plates that include a magnetic material, and are arranged to sandwich the bus bar in a thickness direction of the bus bar, and a magnetic detection element that is arranged between the bus bar and one of the shielding plates, and detects an intensity of magnetic field caused by the current carried through the bus bar. The shielding plate has a length of not less than 20 mm in a length direction of the bus bar, and a width of not less than 24 mm and not more than 38 mm in a width direction orthogonal to the length direction.

14 Claims, 2 Drawing Sheets

(56) References Cited

U.S. PATENT DOCUMENTS

| 2014/0070801 A1* | 3/2014 | Tamura | G01R 15/20 |
| | | | 324/244 |
| 2014/0111196 A1 | 4/2014 | Sakai et al. | |
| 2016/0258985 A1* | 9/2016 | Nomura | G01R 33/09 |
| 2018/0031613 A1* | 2/2018 | Nakayama | G01R 15/205 |

\* cited by examiner

CURRENT SENSOR

BACKGROUND OF THE INVENTION

1. Field of the Invention

This invention relates to a current sensor.

2. Description of the Related Art

A current sensor is known which is provided with a magnetic detection element to detect intensity of magnetic field caused by a measured current (see e.g., JP 4,612,554 B2 and JP 2013/011469 A). The current is calculated based on the intensity of magnetic field to be detected by the magnetic detection element.

JP 2013/011469 A discloses a current sensor that a shielding plate (a magnetic shield part) is configured to surround a measured conductor to carry a measured current and a magnetic detection element to prevent an external magnetic field from influencing the detection result of the magnetic detection element.

SUMMARY OF THE INVENTION

Magnetic saturation in the shielding plate becomes problematic when a high measured current is carried. Although a shielding performance may be enhanced by enlarging the shielding plate, the magnetic saturation is likely to occur since the magnetic field caused by the measured current is subject to collection by the shielding plate.

It is an object to provide a current sensor that allows control of the magnetic saturation in the shielding plate as well as a sufficient shielding performance even when measuring a high current.

According an embodiment of the invention, a current sensor comprises:

a bus bar through which a measured current is carried;

a pair of shielding plates that comprise a magnetic material, and are arranged to sandwich the bus bar in a thickness direction of the bus bar; and a magnetic detection element that is arranged between the bus bar and one of the shielding plates, and detects an intensity of magnetic field caused by the current carried through the bus bar, wherein the shielding plate has a length of not less than 20 mm in a length direction of the bus bar, and a width of not less than 24 mm and not more than 38 mm in a width direction orthogonal to the length direction.

Effects of the Invention

According to an embodiment of the invention, a current sensor can be provided that allows control of the magnetic saturation in the shielding plate as well as a sufficient shielding performance even when measuring a high current.

BRIEF DESCRIPTION OF THE DRAWINGS

Next, the present invention will be explained in conjunction with appended drawings, wherein.

DETAILED DESCRIPTION OF THE PREFERRED EMBODIMENTS

Embodiment

The embodiment in the invention will be described below in conjunction with the appended drawings.

Figure 1A:
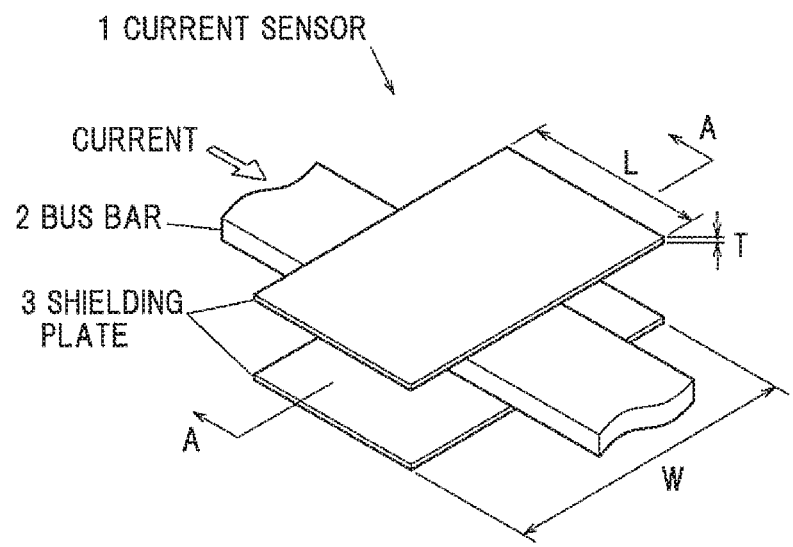
FIG. 1A is a perspective view showing a current sensor according to the embodiment of the invention.
Figure 1B:
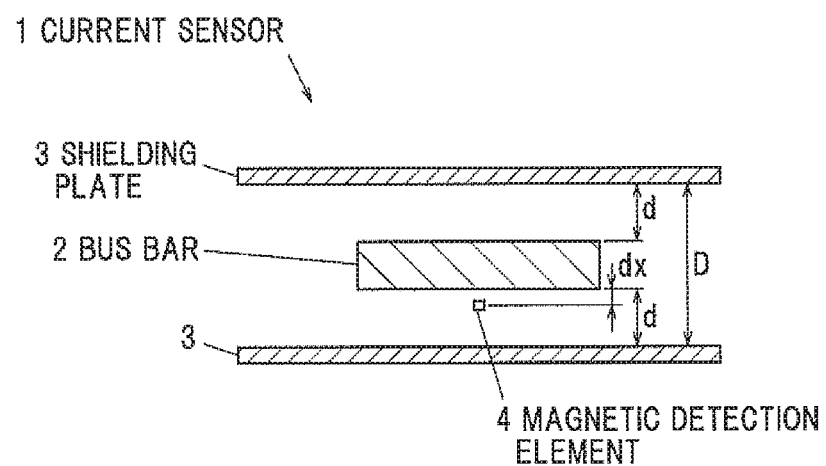
FIG. 1B is a cross sectional view showing the current sensor according to the embodiment of the invention cut along a line A-A in FIG. 1A.

FIG. 1A is a perspective view showing a current sensor according to the embodiment. FIG. 1B is a cross sectional view showing the current sensor according to the embodiment cut along the line A-A in FIG. 1A.

As shown in FIGS. 1A and 1B, the current sensor 1 is provided with the bus bar 2 through which a measured current is carried, a pair of the shielding plates 3 that comprises a magnetic material, and is arranged to sandwich the bus bar 2 in a thickness direction of the bus bar 2, and the magnetic detection element 4 that is arranged between the bus bar 2 and one of the shielding plates 3, and detects an intensity of magnetic field caused by the current carried through the bus bar 2.

The bus bar 2 is a tabular conductor comprising good electrical conductor such as Copper or Aluminum. The bus bar 2 is a current path to pass current. For example, the bus bar 2 is used for a power line between motor and inverter in battery vehicle or hybrid vehicle. In the embodiment, a direct current is carried through the bus bar 2. The current value is not less than 600 A. The current is carried through the current sensor 1 along the longitudinal direction of the bus bar 2. In the embodiment, the bus bar 2 having thickness of 3 mm is used.

The magnetic detection element 4 outputs voltage output signal in accordance with detected intensity of magnetic field (magnetic flux density). For example, the magnetic detection elements such as the Hall element, the Giant Magneto Resistive effect element (the GMR element), the Anisotropic Magneto Resistive element (the AMR element), and the Tunneling Magneto Resistive element (the TMR element) can be used as the magnetic detection element 4.

The shielding plate 3 shields magnetic field from outside such that the magnetic field from outside fails to affect the detection result of the magnetic detection element 4. The shielding plates 3 are arranged to be separated from the bus bar 2 so as to sandwich the bus bar 2 from the thickness direction. The shielding plate 3 is arranged such that the surface of the shielding plate 3 is in parallel with the surface of the bus bar 2 (the thickness direction of the shielding plate 3 corresponds to the thickness direction of the bus bar 2).

Conductive or nonconductive ferromagnet can be used as the shielding plate 3. It is preferable to use the conductive or nonconductive ferromagnet having relative permittivity of not less than 1000 for the shielding plate 3.

Hereinafter, as shown in FIG. 1A, a vertical direction is referred to as a thickness direction, a direction from the left back to the right front is referred to as a length direction, and a direction from the left front to the right back is referred to as a width direction. The shielding plate 3 is formed in a rectangular plate shape having two sides facing each other in the width direction and two sides facing each other in the length direction.

In the current sensor 1, the distances d between both shielding plates 3 and the bus bars 2 (the distance along the thickness direction) are equal. That is, the bus bar 2 is arranged at a position where the distances d from the both shielding plates 3 are equal (the center position between the both shielding plates 3). The both shielding plates 3 are arranged such that the center position in the width direction is opposite to the center position in the width direction of the bus bar 2 in the thickness direction.

The magnetic detection element 4 is arranged at a position where the magnetic detection element 4 is opposite to the center in the length direction and the width direction of the shielding plate 3 in the thickness direction. The distance dx along the thickness direction between the bus bar 2 and the magnetic detection element 4 is set at 1 mm.

Although not shown in FIGS, the magnetic detection element 4 is mounted on a substrate. The substrate is formed in a band shape extended in the width direction. The end of the substrate is inserted between the bus bar 2 and the shielding plate 3. The magnetic detection element 4 is mounted on a bus bar 2 side surface at the end of the substrate.

Although not shown in FIGS, mold resin is filled in a space between the both shielding plates 3. Both of the shielding plates 3, the magnetic detection element 4, and the bus bar 2 are formed integrally by using the mold resin. The mold resin has a function to keep positions of the magnetic detection element 4, the bus bar 2, and the both shielding plates 3, and control detection error caused by vibration. Also, the mold resin has a function to control detection error caused by foreign object entered between the shielding plates 3.

(Description of the Shielding Plate 3)

In the current sensor 1 according to the embodiment, the shielding plate 3 has the length L along the length direction of the bus bar 2 of not less than 20 mm. If the length L of the shielding plate 3 is less than 20 mm, current detection accuracy could be possible to decrease when relatively high magnetic field is applied from outside since the magnetic field is likely to affect the magnetic detection element 4. The length L of the shielding plate 3 is preferable to be not less than 20 mm and not more than 40 mm since the size of the current sensor 1 increases while the shielding performance is not very useful even if the length L of the shielding plate 3 is more than 40 mm. The length L is more preferable to be not less than 20 mm and not more than 30 mm.

When the thickness T of the shielding plate 3 is less than 0.5 mm, it is likely to cause the magnetic saturation in the shielding plate 3 when a high current of not less than 600 A is carried through the bus bar 2. Thus, the thickness T of the shielding plate 3 is preferable to be not less than 0.5 mm. The thickness T is more preferable to be not less than 1 mm to control the magnetic saturation additionally. In the embodiment, the thickness of the shielding plate 3 is set at 1 mm.

When the distance d along the thickness direction between the bus bar 2 and the shielding plate 3 is less than 1 mm, it is likely to cause the magnetic saturation in the shielding plate 3. Meanwhile, when the distance d is more than 5 mm, the distance between the shielding plate 3 and the bus bar 2 is too far and sufficient shield effect may fail to be obtained. Thus, the distance d along the thickness direction between the bus bar 2 and the shielding plate 3 is preferable to be not less than 1 mm and not more than 5 mm. The distance d is preferable to be not less than 2 mm and not more than 4 mm to surely control the magnetic saturation and obtain the shield effect. In the embodiment, the distance d along the thickness direction between the bus bar 2 and the shielding plate 3 is set at 3.5 mm. And the distance D along the thickness direction between the both shielding plates 3 is set at 10 mm.

Hereinafter, the suitable distance W of the shielding plate 3 will be considered. The shield effect in the shielding plate 3 is simulated in each case combining the length L of the shielding plate 3 set at 20 mm, 25 mm, or 30 mm, and the width W set at 20 mm, 30 mm, or 40 mm. The relative permeability of the shielding plate 3 is set at 5000. The magnetic field is applied from outside while no current is carried through the bus bar 2. The shield effect is calculated based on the ratio of the applied magnetic flux density to the magnetic flux density at a position where the magnetic detection element 4 is arranged (the magnetic flux density of the magnetic flux that is not shielded and reaches to the magnetic detection element 4). The simulation result will be described in FIG. 2.

For each above case, the magnetic flux density in the shielding plate 3 when predetermined current is carried through the bus bar 2 (the magnetic flux density of the shielding plate 3 at the center in the length direction, width direction, and thickness direction) is calculated by simulating, and the ratio of the magnetic flux density to the saturation magnetic flux density (it is referred to as the magnetic saturation ratio) is calculated. The magnetic saturation ratio is calculated as a value per ampere of current carried through the bus bar 2. The simulation result will be shown in FIG. 3.

Figure 2:
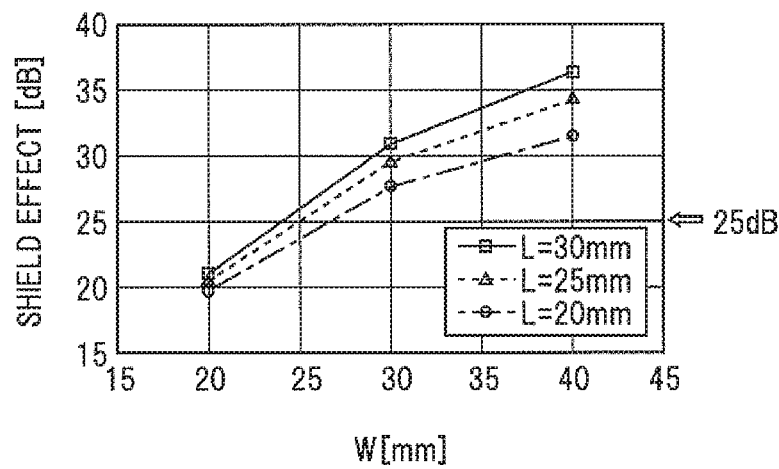
FIG. 2 is a graph chart showing the simulation result of shield effect in a shielding plate of which the length L and the width W are defined as the parameters.
Figure 3:
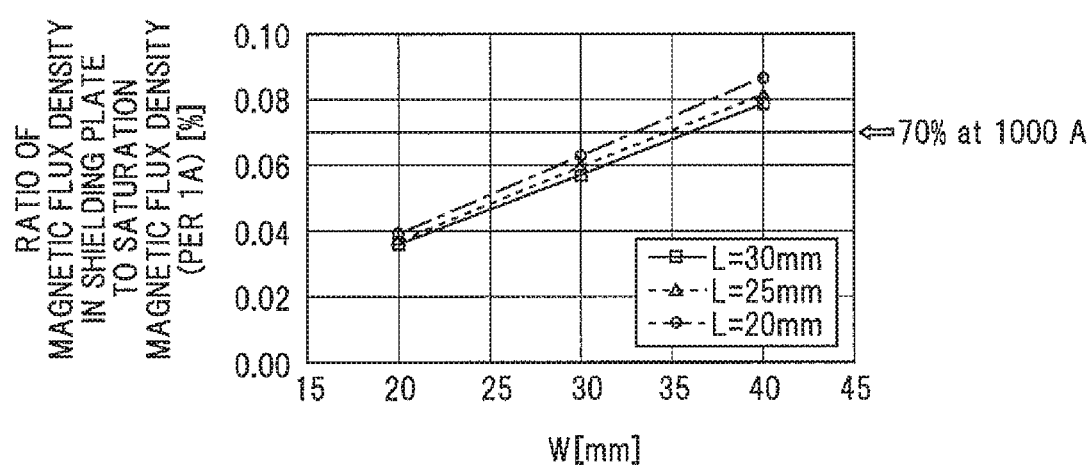
FIG. 3 is a graph chart showing the simulation result of ratio of magnetic flux density in the shielding plate to saturation magnetic flux density, which the length L and the width W of the shielding plate are defined as the parameters.

As shown in FIG. 2, as increasing the width W of shielding plate 3, the shielding performance (the shield effect) is increased. Meanwhile, as shown in FIG. 3, as the width W of the shielding plate 3 increases, the magnetism collection effect increases and it is likely to cause the magnetic saturation since the magnetic field caused by the current is collected by the shielding plate 3 when the bus bar 2 is conducted. That is, in terms of increasing the shielding performance, it is preferable to increase the width W of the shielding plate 3. Meanwhile, in terms of controlling the magnetic saturation, it is preferable to decrease the width W of the shielding plate 3. It is a tradeoff between improvement of the shielding performance and controlling the magnetic saturation. Therefore, it is necessary to adjust the width W of the shielding plate 3 approximately.

In the embodiment, the shield effect of not less than 25 dB is set as the goal. From FIG. 2, it turns out that the width W of the shielding plate 3 has to be at least not less than 24 mm to obtain the shield effect of not less than 25 dB. In each case in which the length L of the shielding plate 3 is set at 20 mm, 25 mm, or 30 mm respectively, it turns out that the width W of the shielding plate 3 has to be at least not less than 27 mm to surely obtain the shield effect of not less than 25 dB.

Meanwhile, in the embodiment, the magnetic saturation ratio of not more than 70% when a current of 1000 A (DC) is carried through the bus bar 2 is set as the goal. In such case, the magnetic saturation ratio per ampere has to be at 0.07%. From FIG. 3, it turns out that the width W of the shielding plate 3 is at least not more than 38 mm to set the magnetic saturation ratio per ampere at not more than 0.07%. Moreover, in each case that the length L of the shielding plate 3 is set at 20 mm, 25 mm, or 30 mm respectively, it turns out that the width W of the shielding plate 3 is at least not less than 33 mm to set the magnetic saturation ratio per ampere at not more than 0.07%.

As shown in the simulation results in FIGS. 2, 3, the width W of the shielding plate 3 has to be not less than 24 mm and not more than 38 mm to obtain the shield effect of not less than 25 dB, and to set the magnetic saturation ratio at not more than 70% when the current of 1000 A is carried through the bus bar 2. It turns out that the width W is more preferable to be not less than 27 mm and not more than 33 mm.

From the inclination shown in FIG. 2, it is considered that improvement effect in the shielding performance is small if the length L of the shielding plate 3 is increased over 30 mm. Also, from the inclination shown in FIG. 3, it is considered that improvement effect in magnetic saturation control is small if the length L of the shielding plate 3 is increased over 30 mm. Thus, in terms of controlling upsizing of the current sensor 1, and obtaining sufficient shield effect and sufficient magnetic saturation control effect, the length L of the shielding plate 3 is preferable to be not less than 20 mm and not more than 30 mm as described above.

For example, when the length L of the shielding plate 3 is set at 25 mm and the width W of the shielding plate 3 is set at 30 mm, the shield effect of approximately 30 dB is obtained and the magnetic saturation ratio when the current of 1000 A is carried through the bus bar 2 is approximately 60%. The current sensor 1 can combine the improvement of the shielding performance and controlling the magnetic saturation.

Effects of the Embodiment

As described above, the current sensor 1 according to the embodiment has the length L of the shielding plate 3 along the length direction of the bus bar 2 of not less than 20 mm, and the width W of the shielding plate 3 in the width direction orthogonal to the length direction of not less than 24 mm and not more than 38 mm.

Thus, the current sensor 1 can control the magnetic saturation sufficiently and obtain sufficient shield effect even if a high direct current of not less than 600 A is measured. The current sensor 1 can improve current measurement accuracy while effect caused by the magnetic field form outside is controlled.

Summary of the Embodiment

Next, technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A current sensor (1), comprising:
a bus bar (2) through which a measured current is carried;
a pair of shielding plates (3) that comprise a magnetic material, and are arranged to sandwich the bus bar (2) in a thickness direction of the bus bar (2); and
a magnetic detection element (4) that is arranged between the bus bar (2) and one of the shielding plates (3), and detects an intensity of magnetic field caused by the current carried through the bus bar (2),
wherein the shielding plate (3) has a length of not less than 20 mm in a length direction of the bus bar (2), and a width of not less than 24 mm and not more than 38 mm in a width direction orthogonal to the length direction.

[2] The current sensor (1) according to [1], wherein the shielding plate (3) has a width of not less than 27 mm and not more than 33 mm.

[3] The current sensor (1) according to [1] or [2], wherein the shielding plate (3) has a length of not less than 20 mm and not more than 30 mm.

[4] The current sensor (1) according to any one of [1] to [3], wherein the shielding plate (3) has a thickness of not less than 0.5 mm.

[5] The current sensor (1) according to any one of [1] to [4], wherein the magnetic detection element (4) is arranged at a position that is opposite a center of the shielding plate (3) in the length direction and the width direction.

[6] The current sensor (1) according to any one of [1] to [5], wherein a distance between the bus bar (2) and the shielding plate (3) in the width direction is not less than 1 mm and not more than 5 mm.

Although the embodiment of the invention has been described, the invention according to claims is not to be limited to the above-mentioned embodiment. Further, please note that all combinations of the features described in the embodiment are not necessary to solve the problem of the invention.

The invention can be appropriately modified and implemented without departing from the gist thereof. Although the current sensor 1 having single bus bar 2 is described in the above embodiment, a plurality of bus bars 2 (e.g., two bus bar 2 corresponding to the power line and the grand line) may be arranged in parallel and two shielding plates 3 and two magnetic detection element 4 may be respectively provided to correspond to each bus bar 2.

The invention claimed is:

1. A current sensor, comprising:
a bus bar through which a measured current is carried;
a pair of shielding plates that comprise a magnetic material, and are arranged to sandwich the bus bar in a thickness direction of the bus bar; and
a magnetic detection element that is arranged between the bus bar and a shielding plate of the shielding plates, and detects an intensity of magnetic field caused by the current carried through the bus bar,
wherein the shielding plate has a length of 20 mm or more in a length direction of the bus bar to maintain a current detection accuracy in the magnetic detection element, and a width in a range from 24 mm to 38 mm in a width direction orthogonal to the length direction to set a magnetic saturation ratio;
wherein the shielding plate has a thickness of 0.5 mm or more, wherein a current value of an electric current passing, through the bus bar is not less than 600 A, and
wherein a longitudinal direction of an extension of the bus bar is perpendicular to a longitudinal direction of an extension of the shielding plate,
wherein the magnetic detection element is arranged at a position that is opposite a center of the shielding plate in the length direction and the width direction.

2. The current sensor according to claim 1, wherein the shielding plate has the width in a range from 27 mm to 33 mm.

3. The current sensor according to claim 1, wherein the shielding plate has the length in a range from 20 mm to 30 mm.

4. The current sensor according to claim 1, wherein a distance between the bus bar and the shielding plate in the width direction is in a range from 1 mm to 5 mm.

5. The current sensor according to claim 1, wherein the electric current passing through the bus bar includes a DC current of not less than 1000 A.

6. The current sensor according to claim 1, wherein a mold resin is filled in a space between the shielding plates.

7. The current sensor according to claim 6, wherein the mold resin maintains positions of the magnetic detection element, the bus bar, and the shielding plates, the mold resin controlling a detection error caused by vibration.

8. The current sensor according to claim 1, wherein the longitudinal direction of the extension of the bus bar is different from the longitudinal direction of the extension of the shielding plate.

9. The current sensor according to claim 1, wherein the bus bar is placed equidistant from each of the shielding plates.

10. A current sensor, comprising:
a bus bar through which a measured current is carried;
a pair of shielding plates that comprise a magnetic material, and are arranged to sandwich the bus bar in a thickness direction of the bus bar;
a magnetic detection element that is arranged between the bus bar and a shielding plate of the shielding plates, and detects an intensity of magnetic field caused by the current carried through the bus bar; and
a mold resin filled in a space between the shielding plates, wherein the shielding plate has a thickness of 0.5 mm or more, wherein a current value of an electric current passing through the bus bar is not less than 600 A, and
wherein a longitudinal direction of an extension of the bus bar is perpendicular to a longitudinal direction of an extension of the shielding plate,
wherein the shielding plate has a length of 20 mm, or more in a length direction of the bus bar, and a width in a range from 24 mm to 38 mm in a width direction orthogonal to the length direction of the bus bar,
wherein the magnetic detection element is arranged at a position that is opposite a center of the shielding plate in the length direction and the width direction.

11. The current sensor according to claim 10, wherein the mold resin maintains positions of the magnetic detection element, the bus bar, and the shielding plates, the mold resin controlling a detection error caused by vibration.

12. The current sensor according to claim 10, wherein the longitudinal direction of the extension of the bus bar is different from the longitudinal direction of the extension of the shielding plate.

13. The current sensor according to claim 10, wherein the shielding plate has the length of 20 mm or more in the length direction of the bus bar to maintain a current detection accuracy in fee magnetic detection element.

14. The current sensor according to claim 10, wherein the shielding plate has the width in the range from 24 mm to 38 mm in the width direction orthogonal to the length direction of the bus bar to set a magnetic saturation ratio.

* * * * *